United States Patent

Hosoi

(10) Patent No.: US 6,717,838 B2
(45) Date of Patent: Apr. 6, 2004

(54) SEMICONDUCTOR STORAGE DEVICE WITH FERROELECTRIC CAPACITOR AND READ TRANSISTOR HAVING GATE COMMUNICATING WITH BIT LINE

(75) Inventor: Yasunari Hosoi, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/208,005

(22) Filed: Jul. 31, 2002

(65) Prior Publication Data

US 2003/0028745 A1 Feb. 6, 2003

(30) Foreign Application Priority Data

Aug. 1, 2001 (JP) ......................................... 2001-233809

(51) Int. Cl.[7] .............................................. G11C 11/22
(52) U.S. Cl. .......................... 365/145; 365/65; 365/149
(58) Field of Search ................................ 365/145, 149, 365/65, 102, 117; 257/295, 311, 321

(56) References Cited

U.S. PATENT DOCUMENTS 6,094,369 A * 7/2000 Ozawa et al. ............... 365/145
6,496,407 B2 * 12/2002 Ashikaga .................... 365/145
6,590,245 B2 * 7/2003 Ashikaga .................... 257/295
2002/0141224 A1 * 10/2002 Shimada et al. ............ 365/145

FOREIGN PATENT DOCUMENTS

JP    2000-156472    6/2000

* cited by examiner

Primary Examiner—Gene Auduong
(74) Attorney, Agent, or Firm—Nixon & Vanderhye P.C.

(57) ABSTRACT

M memory cells (MC) in each of which a ferroelectric capacitor (FC) and a selector transistor (CTR) are connected in series are connected in parallel between a drive line (DL) and a bit line (BL). One end of the bit line (BL) is connected to a gate electrode of a read transistor (STR). Thus, the number of memory cells connected to the bit line (BL) can be reduced so that wiring capacitance of the bit line (BL) can be lowered, without incurring any increases in area and cost, as in the case where a sense amplifier is used. As a result, a voltage induced to the bit line (BL) can be regarded as not depending on remanent polarization of the ferroelectric capacitor (FC). Accordingly, the area of the ferroelectric capacitor (FC) can be reduced, allowing high integration to be implemented.

11 Claims, 8 Drawing Sheets

(a)

(b)

US 6,717,838 B2

SEMICONDUCTOR STORAGE DEVICE WITH FERROELECTRIC CAPACITOR AND READ TRANSISTOR HAVING GATE COMMUNICATING WITH BIT LINE

BACKGROUND OF THE INVENTION

The present invention relates to random-accessible semiconductor storage devices and, more particularly, to a nonvolatile semiconductor storage device including a ferroelectric thin-film capacitor.

In recent years, there have been researched and developed storage devices employing ferroelectric thin film in a storage-use capacitor (hereinafter, referred to as ferroelectric memory), some of which have been put into practical use. This type of ferroelectric memory has such features as nonvolatile random accessibility, high-speed write and read, and multi-time rewritability.

The storage device using ferroelectric thin film is currently available in the following first and second modes, roughly, as classified below. In the first place, the first mode is a destructive ferroelectric memory which uses a capacitor having a ferroelectric thin film sandwiched between upper and lower electrodes (hereinafter, referred to as ferroelectric capacitor) and which reads, by a sense amplifier, voltages of bit lines that occur depending on output charge amounts upon applying a voltage to this ferroelectric capacitor.

In this case, output charge amount differs between cases where the direction of spontaneous polarization of the ferroelectric capacitor is inverted by the applied voltage and where not inverted. The ferroelectric memory stores and reads data on the basis that polarization in the direction of this inversion or non-inversion is taken as data of "1" or "0."

Two types are available for this ferroelectric memory as the first mode, i.e., 1T1C type ferroelectric memory which uses one ferroelectric capacitor and one selector transistor for one piece of information like DRAM (Dynamic Random Access Memory) and 2T2C type ferroelectric memory which uses two ferroelectric capacitors and two selector transistors for the same.

In the 1T1C type ferroelectric memory, a read voltage is applied to ferroelectric capacitors of selected memory cells for driving, and charges in amounts corresponding to data that have previously been written in the ferroelectric capacitors are outputted to bit lines for data read by a sense amplifier. For this operation, a reference voltage for comparison with the sense amplifier needs to be generated with a dummy cell (reference cell) or the like. It is noted that the reference voltage is required to fall between the voltages corresponding to "1" and "0," desirably being just intermediate therebetween for the ensuring of margin.

Now basic properties of a semiconductor storage device using the 1T1C type ferroelectric memory are explained.

As a voltage is applied to between first and second electrodes of the ferroelectric capacitor, in which a ferroelectric thin film is sandwiched by the first and second electrodes, the amount of polarization of the ferroelectric capacitor draws a hysteresis loop as shown in FIG. 7. In FIG. 7, increasing a drive voltage VD from the state of a point A (drive voltage VD=0) causes the amount of polarization of the ferroelectric to increase nonlinearly as indicated by arrows so as to reach a point B (VD=maximum drive voltage $VD_{MAX}$). Further, lowering the drive voltage VD back to 0 causes the amount of polarization to draw a curve BC different from the curve AB so as to reach a point C. Furthermore, applying the drive voltage in the negative direction causes the amount of polarization to reach a point D at a minimum drive voltage ($-VD_{MAX}$), and returning the drive voltage VD again to 0 causes the amount of polarization to return to the original point A.

Consequently, depending on the hysteresis of the applied voltage, the ferroelectric capacitor can take different amounts of polarization like the point A or the point B even with no voltage applied. In this case, assuming the state of point A as a logical "1" and the state of point C as a logical "0" makes it possible to hold two values in a state that the applied voltage is zero.

That is, this ferroelectric memory fulfills a nonvolatile memory that needs no refresh operations or a low power consumption memory that requires fewer refresh operations than DRAMs by using the above hysteretic property. Whereas write operation on the ferroelectric memory is performed by applying a drive voltage to the electrodes of the ferroelectric capacitor as described above, read operation thereon is done similarly by applying a voltage to the ferroelectric capacitor.

In this connection, in conventional 1T1C type ferroelectric memories, a bit line and a drive line to which the ferroelectric capacitor is connected via the selector transistor are controlled prior to a read operation so as to be equal in potential to each other, so that the bit line is already in a floating state at the time of the read operation. In this case, given a capacitance Cf of the ferroelectric capacitor and a wiring capacitance Cb of the bit line, the resultant equivalent circuit is as shown in FIG. 8.

Then, when the drive voltage VD is applied to a drive line DL, a relational expression of a voltage Vb of a bit line BL can be expressed as follows, where the amount of charges stored in the ferroelectric capacitor is assumed to be Q:

$$Q=Cf(VD-Vb)=CfVf$$

$$Q=CbVb$$

where Cf is the nonlinear capacitance inherent in the ferroelectric and Vf is the voltage actually applied to the ferroelectric capacitor.

From these equations, it can be understood that with respect to the voltage Vb outputted to the bit line BL, actual Q and Vb can be determined from an intersecting point between a hysteresis graph of the performance chart showing Q-V characteristics of the ferroelectric capacitor and a load line passing through a point (V,Q)=(VD,0) with a gradient of −Cb.

Accordingly, in a state that a logical "1" has been written, turning ON the switch (selector transistor) so that VD goes "H" results in performance line and load line transitions as shown in FIG. 9, showing that an actual result of (Vf,Vb, Q)=(Vf1,Vb1,Q1) can be determined from an intersecting point A1. Likewise, in a state that a logical "0" has been written, turning ON the switch (selector transistor) so that VD goes "H" results in transitions as shown in FIG. 10, allowing (Vf,Vb,Q)=(Vf0,Vb0,Q0) to be determined from charge amount and voltage at an intersecting point A0. In this connection, since the voltage Vb1 and the voltage Vb0 take different values from each other, enough voltage difference therebetween allows data read by a sense amplifier SA or the like to be achieved.

On the other hand, in the 2T2C type ferroelectric memory, spontaneous polarizations in different directions have been written in a set of two ferroelectric capacitors, respectively, and inverted or noninverted charges of amounts resulting from driving the individual ferroelectric capacitors are outputted to a bit line and a bit line bar, where levels of those voltages are compared with each other for achievement of data read. For this purpose, the 2T2C type ferroelectric memory has a margin about double that of the 1T1C type ferroelectric memory.

Next, the second mode employs ferroelectric thin film instead of gate oxide of the gate transistor, being also called MFS-FET (Metal/Ferroelectric/Semiconductor—Field Emission Transistor) or 1-transistor (1T) type ferroelectric memory. In this second mode, data storage and read are enabled by determining whether to turn ON or OFF the transistors by using carriers induced to the semiconductor by spontaneous polarizations of the ferroelectrics.

In the case of the 1T type ferroelectric memory, since read is carried out in a static state, nondestructive read is enabled.

However, these 1T1C type ferroelectric memory and 2T2C type ferroelectric memory as the first mode of the prior art have a problem as shown below. That is, the 1T1C type ferroelectric memory and the 2T2C type ferroelectric memory are of the method that involves outputting a remanent polarization amount of the ferroelectric capacitor to a bit line and reading the level of a voltage outputted to the bit line.

With data of "1" or "0" stored in the ferroelectric capacitor, if the amount of charges to be outputted to the bit line by a read operation is Qf1 or Qf0 and if the capacitance of the bit line is Cb, then the voltage Vb1 or Vb0 induced to the bit line can be expressed as follows:

$$Vb1=Qf1/Cb$$

$$Vb0=Qf0/Cb.$$

Therefore, read margin $\Delta V$ can be expressed as $$\Delta V=Vb1-Vb0.$$

In this case, along with scale-down, capacitor area of the ferroelectric decreases in proportion to $F^2$, where a minimum machining size is assumed to be F. Therefore, whereas the output charge amount Qf also decreases in proportion to $F^2$, the bit line capacitance Cb scarcely decreases. Accordingly, as the memory cells are reduced in scale, the hysteresis graph of the performance chart shown in FIG. 9 results in one indicated by dotted line. This results in a problem that the bit line voltage for a logical "1" decreases as shown by Vb1', so that the read margin $\Delta V$ decreases resultantly, making data read hard to achieve, unfortunately.

In this case, decreasing the number of ferroelectric capacitors connected to one bit line BL makes the wiring capacitance Cb of the bit line BL decreased (making the gradient of the load line gentler), thus making the bit line voltage Vb1' increased, with the read margin $\Delta V$ increased. However, in this case, keeping the total number of ferroelectric capacitors of the semiconductor storage device unchanged would cause the number of bit lines BL to increase, making the number of sense amplifiers increased as well proportionally. Accordingly, due to the increase in the number of sense amplifiers, the area of the semiconductor storage device also increases, posing a problem that integration cannot be attained for the reduction in the memory cells while the cost is increased.

Meanwhile, the 1T type ferroelectric memory as the second mode of the prior art has the following problems. That is, for the 1T type ferroelectric memory, indeed such problems associated with scaling as described above do not occur, but because of the need for forming a ferroelectric, which is an oxide, directly on oxidation-prone silicon, it is very difficult to obtain successful interfaces. That is, upon occurrence of a $SiO_2$ layer even to a few nm due to oxidation of silicon, because of $SiO_2$'s quite low dielectric constant compared with ferroelectrics, most of the voltage applied to the gate electrode would be applied to the $SiO_2$ layer, so that the direction of polarization of the ferroelectric could not be inverted without applying a stronger voltage. This poses a problem that the operating voltage would be higher resultantly.

Also, as a solution to the above issue in manufacture, there has been proposed a 1T type ferroelectric memory called MFIS-FET in which not the ferroelectric is deposited directly on the silicon substrate, but a paraelectric buffer layer is interposed therebetween or a 1T type ferroelectric memory called MFMIS-FET in which a conductor is formed on a buffer layer. Even in these cases, however, the ferroelectric memories are difficult to manufacture and moreover the voltage would be applied even to the buffer layer, leading to a problem that the voltage to be applied to the ferroelectric would be decreased resultantly.

Furthermore, in the case of the MFMIS-FET, charges stored in the conductor in a write operation causes a potential difference to be generated between the conductor and the gate, leading to occurrence of leaks. This poses a problem that stable data retention for prolonged time would be difficult to achieve.

SUMMARY OF THE INVENTION

Accordingly, an object of the present invention is to provide a semiconductor storage device which is highly integratable and high in reliability and which is capable of power consumption reduction and high-speed operation and further which employs an easy-to-fabricate ferroelectric thin film.

In order to achieve the above object, according to the present invention, there is provided a semiconductor storage device comprising:

a memory cell which includes a ferroelectric capacitor and a selector transistor, the ferroelectric capacitor comprising a first electrode, a second electrode opposed to the first electrode, and a ferroelectric thin film sandwiched between the first electrode and the second electrode, and the selector transistor having a first main electrode connected to the second electrode;

a drive line connected to either one of the first electrode of the ferroelectric capacitor or a second main electrode of the selector transistor;

a bit line connected to the other one of the first electrode of the ferroelectric capacitor or the second main electrode of the selector transistor; and a read transistor having a gate electrode connected to the bit line.

With this constitution, for a read operation, the bit line and the drive line are pre-charged so as to become equal in potential to each other. After that, the bit line is set floating, the selector transistor is turned ON, and the drive line is boosted up to a drive voltage. In this operation, if the voltage difference of the bit line between inverted and noninverted modes is sufficiently larger than the threshold voltage of the read transistor, then the read transistor is automatically turned ON in the case of inversion, so that an output for read can be obtained.

As shown above, voltages of the bit line in the inverted mode and noninverted mode are discriminated by the read transistor. Therefore, when the number of memory cells connected to the bit line is reduced in order to lower the wiring capacitance of the bit line, then the number of bit lines would increase, given that the total number of memory cells is maintained unchanged, where the number of read transistors would also increase proportionally. Nonetheless, increases in area and cost due to the increase in the number of read transistors do not matter, compared with the case where the sense amplifier is used as in the prior art.

From the above description, the voltage induced to the bit line can be regarded as not depending on the absolute quantity of remanent polarization of the ferroelectric capacitor. Accordingly, it becomes implementable to reduce the capacitor area of the ferroelectric capacitor and to fulfill a high-integration semiconductor storage device.

Also, in an embodiment, at least two of the memory cells are connected in parallel to the bit line, and one main electrode of a block-selector transistor is connected to one end of the bit line, thereby constituting a memory cell block; the bit lines of at least two of the memory cell blocks are connected in series via the block-selector transistor.

If the number of memory cells connected in parallel to the bit line is increased, the stray capacitance (wiring capacitance) of the bit line also increases. As a result, as can be seen from FIG. 9, the output voltage Vbl to the bit line particularly in the inversion mode would be lowered, causing the read margin to be decreased. In this embodiment, the memory cell block includes the bit line in which at least two memory cells are connected in parallel, and the bit lines of at least two memory cell blocks are connected in series via the block-selector transistors. Thus, by setting the number of memory cells connected to the bit lines of the memory cell blocks so that the stray capacitance (wiring capacitance) of the bit lines comes to allow an optimum read margin to be obtained, both enhanced multiple memory cells and optimum read margin can be fulfilled at the same time. Moreover, the semiconductor storage device becomes accessible without using a sense amplifier, thus capable of high-speed operation.

Also, in an embodiment, the bit line and the drive line are disposed in parallel to each other.

In this embodiment, the bit lines and the drive lines, which are connected to both ends of the memory cell, are disposed parallel to each other. Accordingly, the word line connected to the gate electrode of the selector transistor and the drive line cross each other perpendicularly. As a result, through the selection by the word line and the application of the drive voltage by the drive lines, only one memory cell located at the cross-point of the word line and the drive line is accessed Thus, reduction in power consumption and high speed operation are enabled. Moreover, as a result of this, the number of read/rewrite operations is reduced to a large extent, so that the semiconductor storage device can maintain high reliability.

Also, in an embodiment, the bit line and the drive line are disposed vertical to each other.

In this embodiment, the bit line and the drive line connected to both ends of the memory cell are disposed vertical to each other. Accordingly, the word line and the drive line connected to the gate electrode of the selector transistor are parallel to each other. As a result, through the selection by the word lines and the application of the drive voltage by the drive lines, all the memory cells that are connected in parallel to the word lines and the drive lines are accessed. Thus, 1-line batch operation is enabled.

Also, in an embodiment, electric capacitance of the bit line is not less than ½ and not more than five times electric capacitance of the ferroelectric capacitor that does not include any inverted charge amount.

In this embodiment, the hysteresis curve can intersect the load line representing the bit line capacitance Cb in the inversion region of the performance chart of the ferroelectric capacitor in the inversion mode. Therefore, the voltage difference of the bit line between inversion and non-inversion can be obtained as not less than a specified value stably, allowing a large read margin to be obtained.

Furthermore, only a voltage around the anti-voltage is applied to the ferroelectric capacitor during the read operation in the inversion mode, hence not a perfect inversion. Thus, such deteriorations as fatigue or so-called imprints of the ferroelectric memory hardly occur, so that the semiconductor storage device can maintain high reliability.

Also, in an embodiment, anti-voltage of the ferroelectric capacitor is not less than $\frac{1}{10}$ and not more than ½ of its drive voltage.

In this embodiment, the anti-voltage of the ferroelectric capacitor is not more than ½ of the drive voltage. Accordingly, the output voltage to the bit line is increased in the inversion mode. Further, the anti-voltage of the ferroelectric capacitor is not less than $\frac{1}{10}$ of the drive voltage. Accordingly, it never occurs that excessively small anti-voltage causes the electric capacitance in the non-inversion mode to increase, and therefore the output voltage to the bit line is decreased. As a result, the voltage difference of the bit line between inversion and non-inversion can be obtained as not less than a specified value stably, allowing a large read margin to be obtained.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinbelow, the present invention is described in detail by way of embodiments thereof illustrated in the accompanying drawings.

(First Embodiment)

Figure 1:
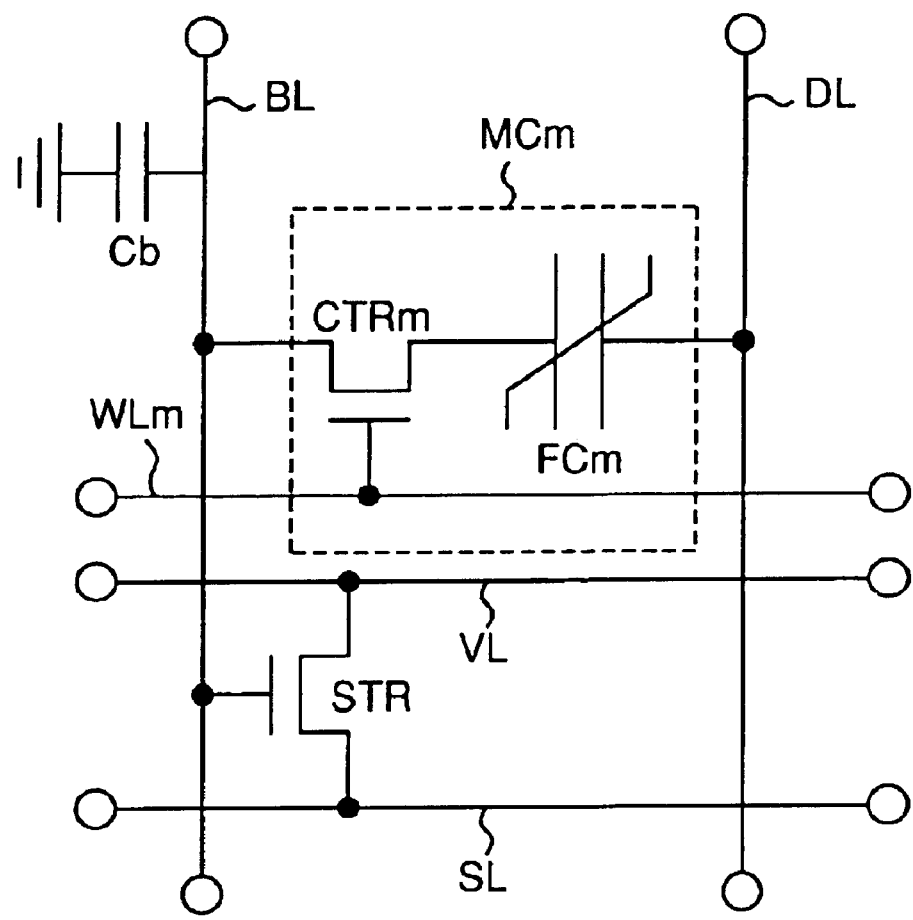
FIG. 1 is an equivalent circuit diagram showing a fundamental circuit of a semiconductor storage device of the present invention.

FIG. 1 is an equivalent circuit diagram showing a fundamental circuit of a semiconductor storage device according to this embodiment. A ferroelectric capacitor FCm (m=1, 2, 3, . . . , M) whose first electrode is connected to a drive line DL has a second electrode connected to one main electrode of a selector transistor CTRm, the other main electrode of which is connected to a gate electrode of a read transistor STR via a bit line BL. Also, the gate electrode of the selector transistor CTRm is connected to a word line WLm. One main electrode of the read transistor STR is connected to a read power supply line VL while the other main electrode is connected to a read output line SL.

Hereinafter, a couple of the selector transistor CTRm and the ferroelectric capacitor FCm, which are connected in series, will be referred to as a memory cell MCm.

Figure 2:
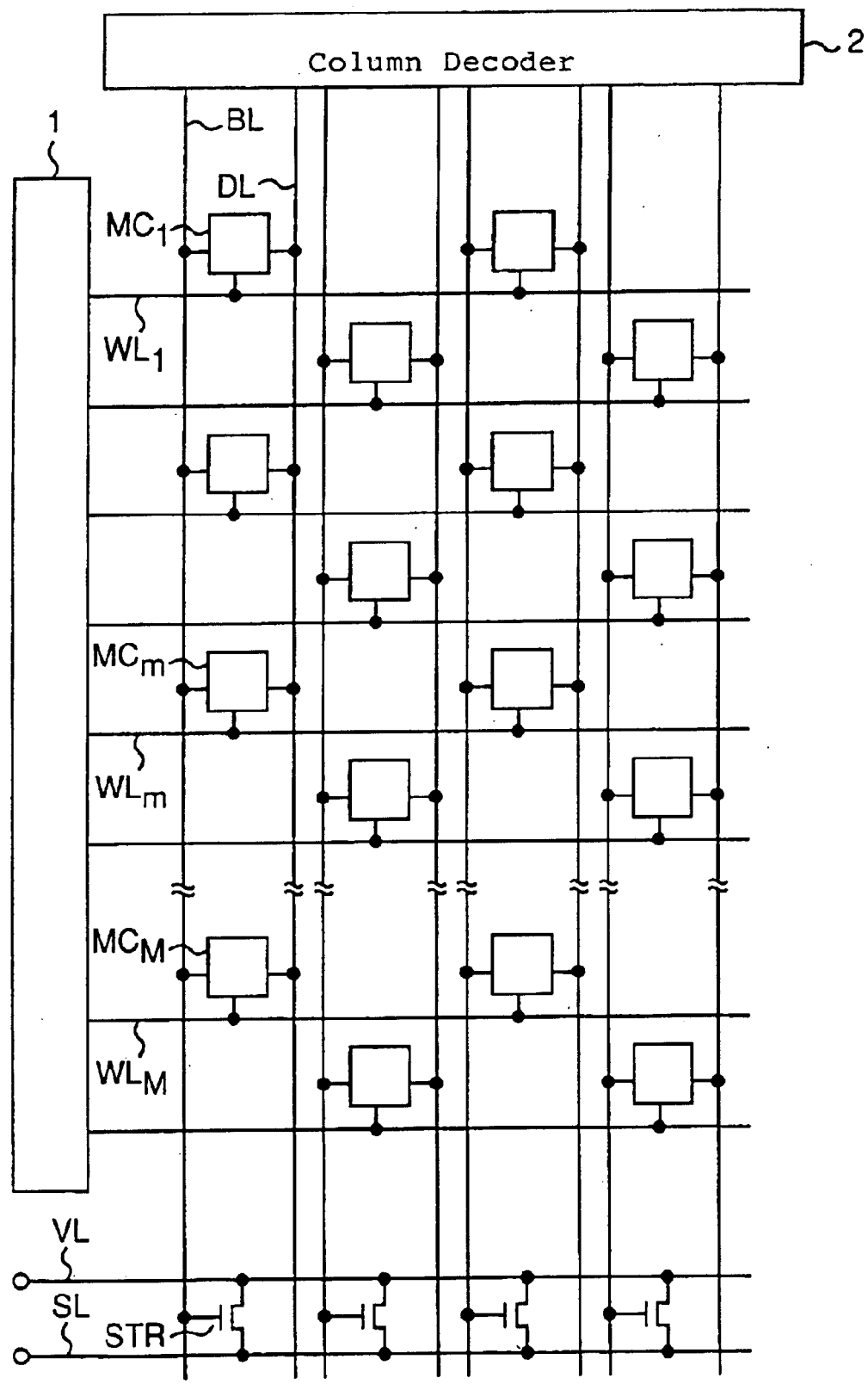
FIG. 2 is a circuit diagram of a semiconductor storage device in which the fundamental circuit shown in FIG. 1 is disposed in a matrix array.

This embodiment has an arrangement that, as shown in FIG. 2, M memory cells MCm are connected to a bit line BL and a drive line DL in parallel, and this unit is arrayed in parallel so that the memory cells MCm are disposed in a matrix. Then, the word lines WLm are connected to a row decoder 1, and the bit lines BL and the drive lines DL are connected to a column decoder 2. Hereinbelow, a ferroelectric capacitor, a selector transistor, a word line and a memory cell, when referred to generically, will be called simply as ferroelectric capacitor FC, selector transistor CTR, word line WL and memory cell MC with array subindexes m omitted from their reference characters.

Further in this embodiment, as shown in FIG. 1, the ferroelectric capacitor FC is connected to the drive line DL side, while the selector transistor CTR is connected to the bit line BL side. However, it may also be arranged without any problem that one electrode of the ferroelectric capacitor FC is connected to the bit line BL while the main electrodes of the selector transistor CTR are connected to the other electrode of the ferroelectric capacitor FC and the drive line DL.

In this embodiment, SBT ($SrBi_2Ta_2O_9$) is used as the ferroelectric material of the ferroelectric capacitor FC. This ferroelectric capacitor FC using SBT exhibits a successful saturation characteristic that the anti-voltage Vc is less than 1 V, as well as a successful ferroelectric characteristic that the remanent polarization amount $\Delta Q$ is not less than 23 $\mu C/cm^2$. Also, 32 (M=32) memory cells MC are connected to the bit line BL, and their stray capacitance Cb is about 150 fF.

Next, read operation of the semiconductor storage device having the above constitution is explained. Referring to FIGS. 1 and 2, the bit line BL and the drive line DL connected to the first electrode of the ferroelectric capacitor FC are pre-charged by the column decoder 2 so as to become equal in potential to each other. After that, the bit line BL is set floating by the column decoder 2, the selector transistor CTR is turned ON by the row decoder 1 via the word line WL, and the drive line DL is boosted up to a drive voltage VD=5 V by the column decoder 2.

Figure 3:
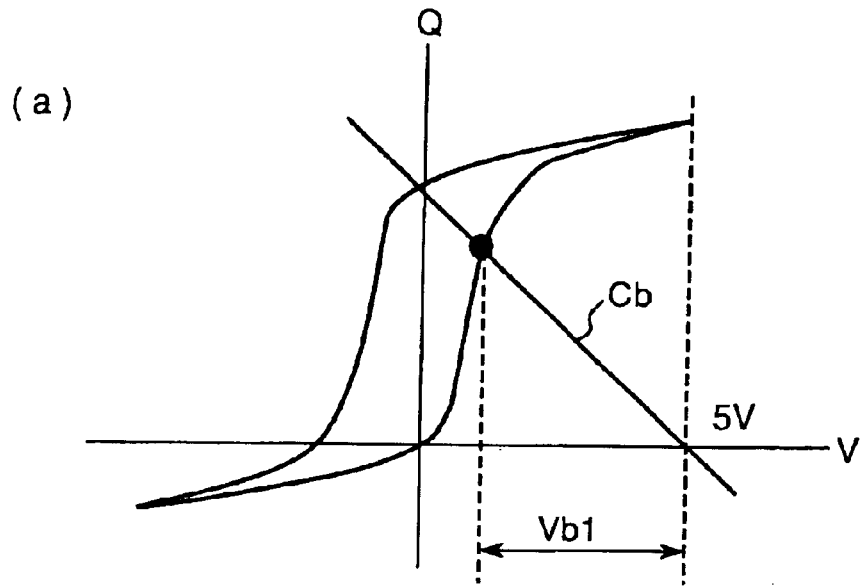
FIGS. 3A and 3B are performance charts for cases where data "1" and "0," respectively, have been written in the fundamental circuit shown in FIG. 1.
Figure 3:
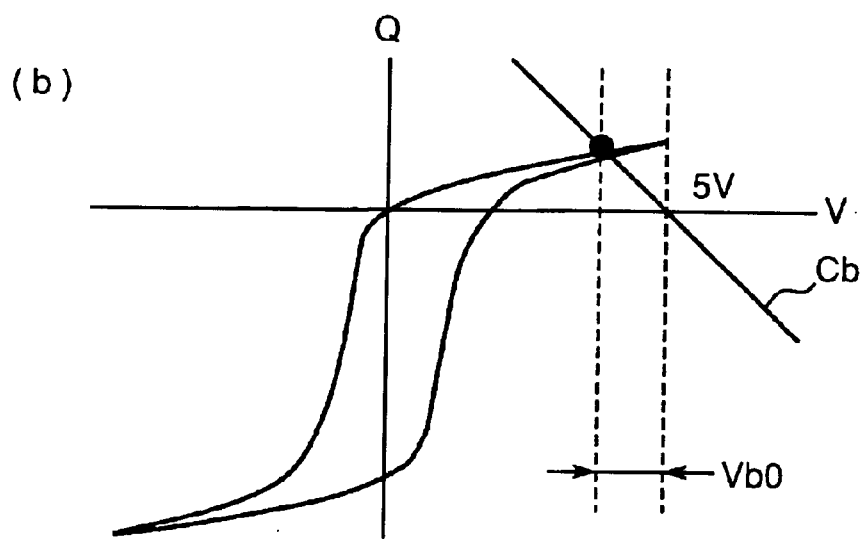

Then, assuming that the voltage occurring to the bit line BL is Vb, the performance chart for a case where data "1" has been written (a case of inversion) results in one shown in FIG. 3A. The performance chart for a case where data "0" has been written (a case of non-inversion) results in one shown in FIG. 3B. Accordingly, in the case where data "1" has been written, the voltage Vb1 of the bit line BL is about 4 V from FIG. 3A. Likewise, in the case where a "0" has been written, Vb0=approx. 1.5 V. As a result, a difference in the bit line voltages Vb due to the states of storage is $\Delta Vb=Vb1-Vb0$=approx. 2.5 V. This voltage difference $\Delta Vb$ is enough larger than the threshold voltage 700 mV of the MOS transistor as the read transistor STR.

Accordingly, performing ON/OFF control of the read transistors STR according to data written in selected ferroelectric capacitors FC allows data read by read output lines SL to be achieved. That is, by selecting bit lines BL and drive lines DL by the column decoder 2 while selecting word lines WL by the row decoder 1 allows only memory cells MC located at intersecting positions between the selected word lines WL and the selected drive lines DL to be accessed and read at high speed.

During this operation, it could be predicted that small voltage may be applied also to the ferroelectric capacitors FC of memory cells MC that are not selected because of their selector transistors CTR being OFF but that share the drive lines DL with the selected memory cells MC. However, since the capacitance ratio of paraelectric components of normal ferroelectric capacitors FC to capacitance of transistors is about 50:1, a voltage of only about 0.1 V would actually be applied to the ferroelectric capacitors FC, so that polarization inversion scarcely occurs.

Subsequent to the read operation as described above, a rewrite operation based on a read result can be carried out. That is, based on the result of reading a bit line BL, if the read result is a "1," then an appropriate rewrite voltage Vw is set; if the result is a "0," connection to the ground is done and subsequently the voltage of the drive line DL is dropped to the ground voltage. Finally, the bit line BL is dropped to the ground voltage to make the selector transistor CTR turned OFF, thus allowing the state prior to the read operation to be restored (rewrite operation).

Next, write operation is explained. First, the drive line DL is boosted to the rewrite voltage Vw. Then, the bit line BL is set to a voltage corresponding to data to be written (voltage Vw (V) for "1," and 0 (V) for "0"). Further, turning ON the selector transistor CTR allows 0 to be written for a "0" write operation, while write operation is not done for a "1" write operation since no voltage difference occurs to between the electrodes of the ferroelectric capacitor FC. Furthermore, dropping the drive line DL to the ground allows a "1" to be written for a "1" write operation, while the "0" state is maintained as it is for a "0" write operation.

As shown above, in this embodiment, M (M: positive integer) memory cells MC in each of which the ferroelectric capacitor FC having ferroelectric thin film sandwiched between first and second electrodes and the selector transistor CTR are connected in series are connected in parallel between the drive line DL and the bit line BL. Then, one end of the bit line BL is connected to the gate electrode of the read transistor STR, and the word line WL is connected to the gate electrode of the selector transistor CTR. Also, the word line WL and the drive line DL are disposed vertical to each other while the drive line DL and the bit line BL are disposed in parallel to each other, by which the memory cells MC are arrayed in a matrix.

In this case, it can be seen from FIGS. 3A and 3B that the read margin $\Delta V$, which is the difference between the voltages Vb1 and Vb0 of the bit line BL at inversion and non-inversion, respectively, can be made larger when the wiring capacitance Cb of the bit line BL is smaller. Therefore, in order to lower the wiring capacitance Cb, it could be conceived to reduce the number M of memory cells connected to the bit line BL. However, reducing the number M of memory cells would cause the number of bit lines BL to increase, given that the total number of memory cells is maintained unchanged, where the number of read transistors STR would also increase proportionally. Nonetheless, even in such a case, increases in area and cost due to the increase in the number of read transistors STR do not matter, compared with the case where the sense amplifier is used as in the prior art.

From the above description, the voltage Vb induced to the bit line BL can be regarded as not depending on the absolute quantity of remanent polarization of the ferroelectric capacitor FC. Accordingly, it becomes implementable to reduce the capacitor area of the ferroelectric capacitor FC without the need for enlarging the absolute quantity of remanent polarization in order to ensure the read margin ΔV over a specified value. Thus, a high-integration semiconductor storage device can be implemented.

Besides, in that case, there is no need for any reference cell, as would be involved in the case where the sense amplifier is used for discrimination between the voltages Vb1 and Vb0 of the bit line BL at inversion and non-inversion, respectively. Therefore, increases in area as well as increases in cost due to increases in the number of reference cells because of increases in the number of bit lines BL can also be suppressed.

Furthermore, for the read operation, selector transistors CTR of memory cells MC arrayed along the row direction out of the memory cells MC arrayed in a matrix as shown in FIG. 2 are turned ON by turning the word lines WL to "H" level by the row decoder 1, so that the memory cells MC are selected on the row basis. Then, the pre-charging of bit lines BL and drive lines DL, the floating of bit lines BL and the boosting of drive lines DL as described above are performed by the column decoder 2 on the column basis. If an output is detected on the read output line SL, it is decided that the data for memory cells MC located at cross-points between the selected word lines WL and the boosted drive lines DL is "1." If no output is detected, on the other hand, it is decided that the data for the memory cells MC is "0."

Thus, reduction in power consumption and high speed operation are enabled by accessing only memory cells MC located at the cross-points between the selected word lines WL and the boosted drive lines DL. Then, as a result of this, the number of read/rewrite operations is reduced to a large extent, so that the semiconductor storage device can maintain high reliability. In this case, the semiconductor storage device is capable of random access without using any sense amplifier as described above, thus enabled to fulfill high-speed operations.

(Second Embodiment)

Figure 4:
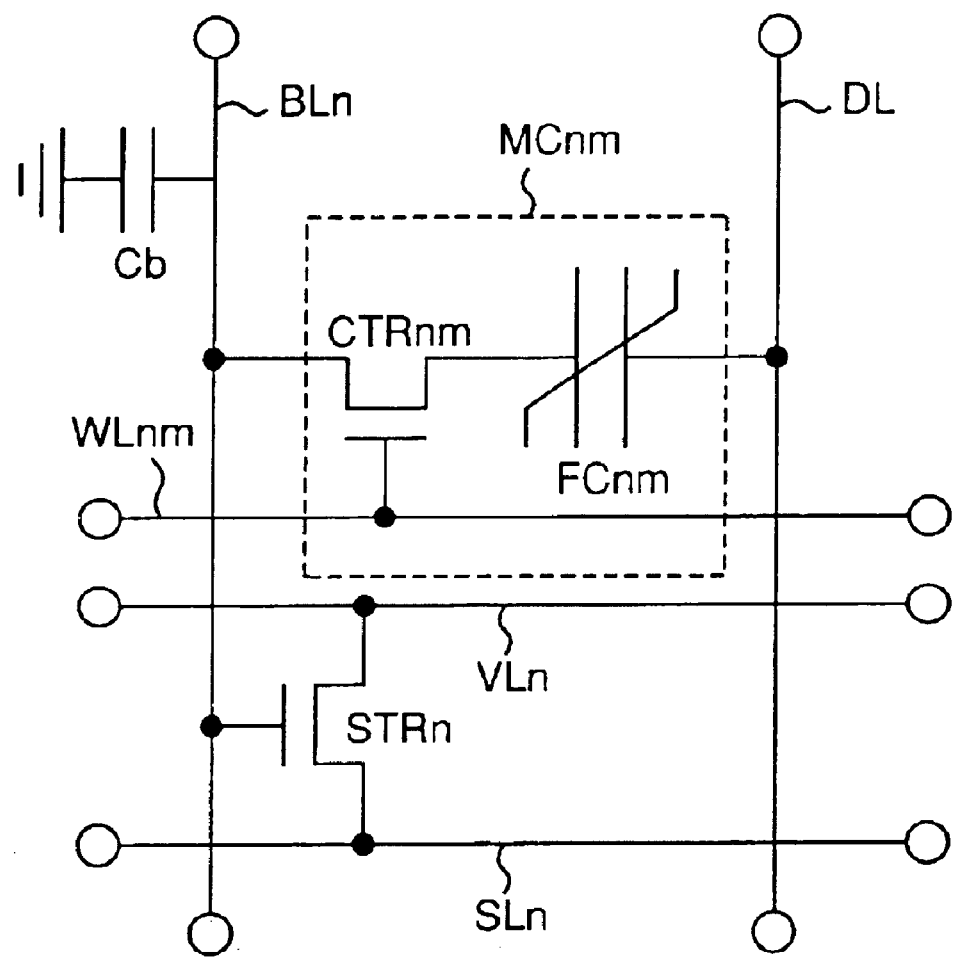
FIG. 4 is an equivalent circuit diagram showing a fundamental circuit of a semiconductor storage device different from FIG. 1.

FIG. 4 is an equivalent circuit diagram showing a fundamental circuit of a semiconductor storage device according to this embodiment, similar to the equivalent circuit of the first embodiment shown in FIG. 1. A ferroelectric capacitor FCnm (n=1, 2, 3, . . . , N, m=1, 2, 3, . . . , M) whose first electrode is connected to a drive line DL has a second electrode connected to one main electrode of a selector transistor CTRnm, the other main electrode of which is connected to a gate electrode of a read transistor STRn via a bit line BLn disposed parallel to the drive line DL. The selector transistor CTRnm and the ferroelectric capacitor FCnm connected in series constitute a memory cell MCnm. Also, the gate electrode of the selector transistor CTRnm is connected to a word line WLnm disposed vertical to the bit line BLn. One main electrode of the read transistor STRn is connected to a read power supply line VLn while the other main electrode is connected to a read output line SLn.

Figure 5:
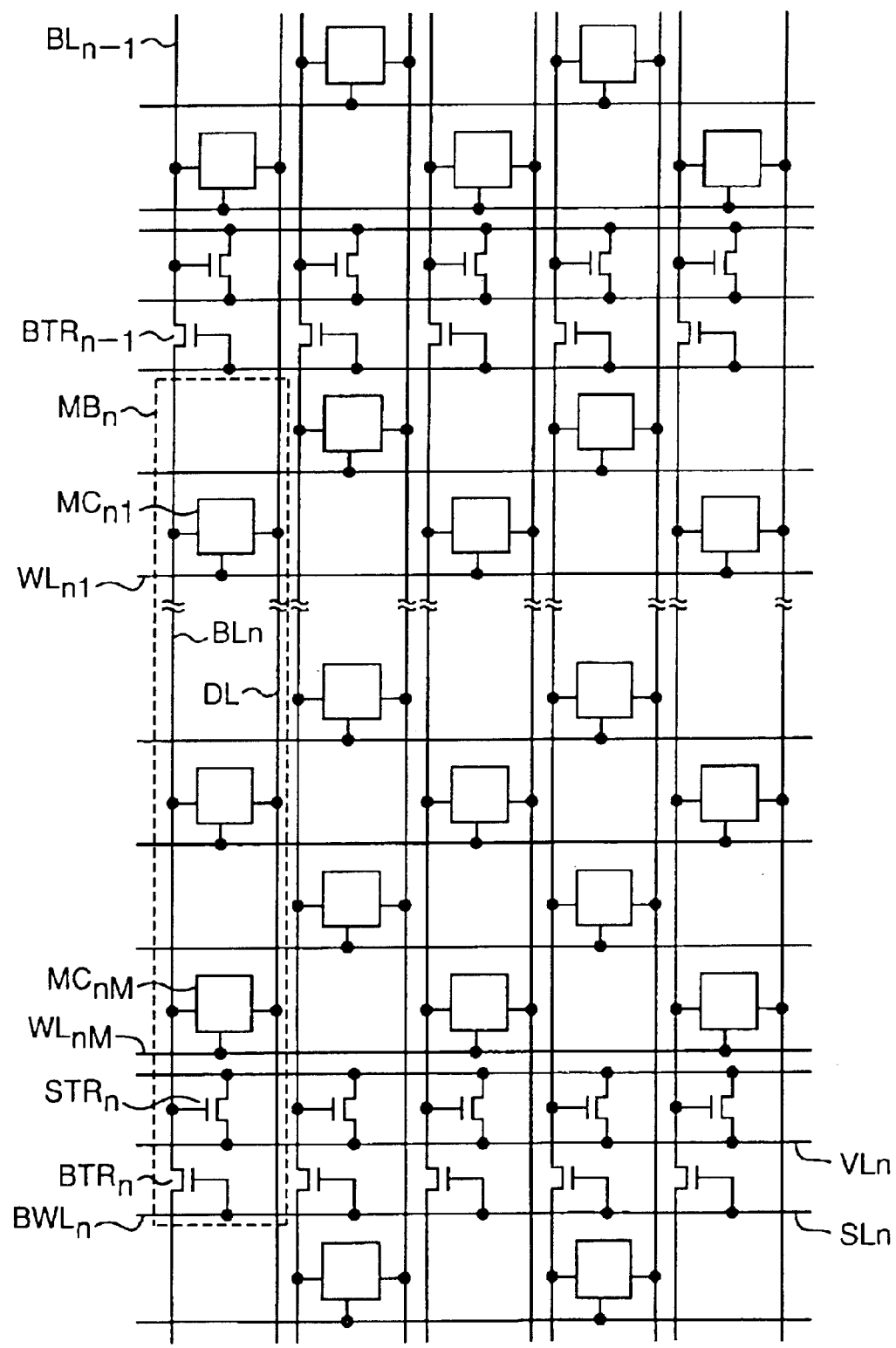
FIG. 5 is a circuit diagram of memory cell blocks using the fundamental circuit shown in FIG. 4.

As shown in FIG. 5, M memory cells are connected to one bit line BLn in parallel to constitute a memory cell block MBn. The bit line BLn for N memory cell blocks MBn is connected in series via N block-selector transistors BTRn.

That is, one end of one bit line BLn is connected to one main electrode of the block-selector transistor BTRn, and the other end is connected to the other main electrode of the block-selector transistor BTRn−1. Also, one main electrode of the block-selector transistor BTRn−1 is connected to a bit line BLn−1 of an adjacent memory cell block MBn−1 (not shown). Further, the gate electrode of the block-selector transistor BTRn is connected to a block-selector line BWLn disposed vertical to the bit line BLn.

Figure 6:
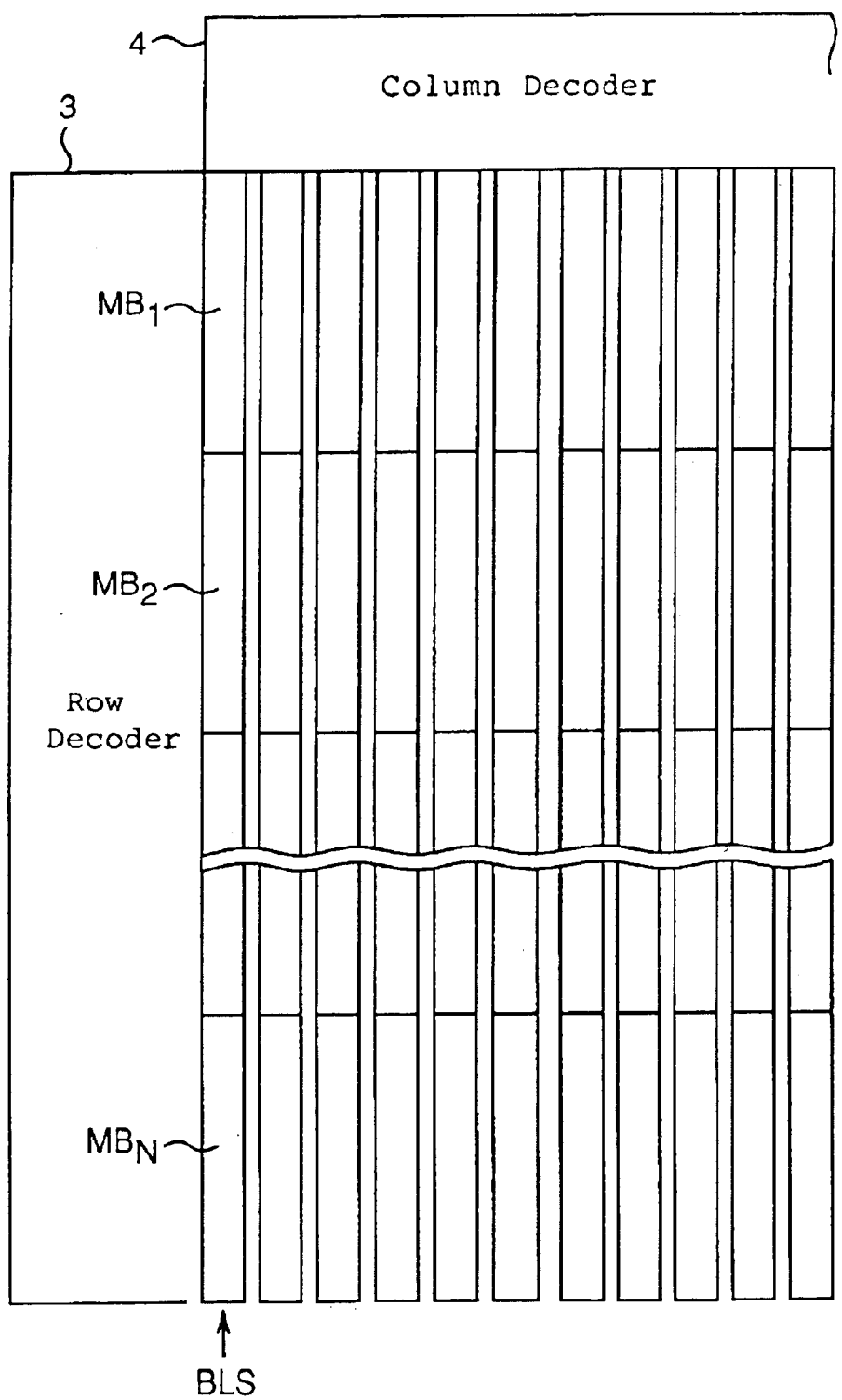
FIG. 6 is a circuit diagram of a semiconductor storage device in which the memory cells shown in FIG. 5 are disposed in a matrix array.
Figure 7:
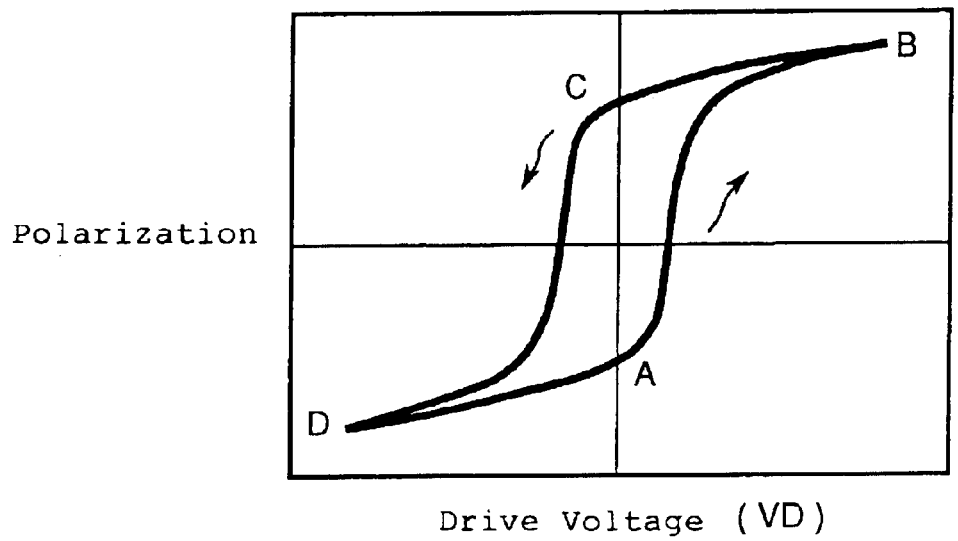
FIG. 7 is a chart showing a relationship between drive voltage and polarization amount in a ferroelectric capacitor.
Figure 8:
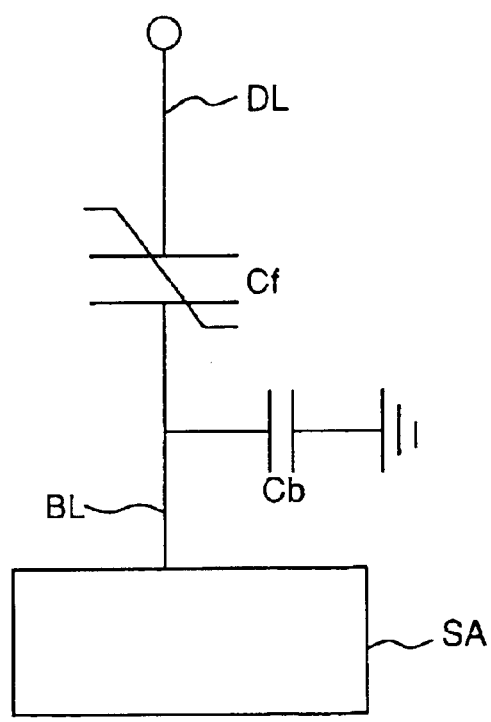
FIG. 8 is an equivalent circuit diagram for a read operation in the 1T1C type ferroelectric memory of the prior art.
Figure 9:
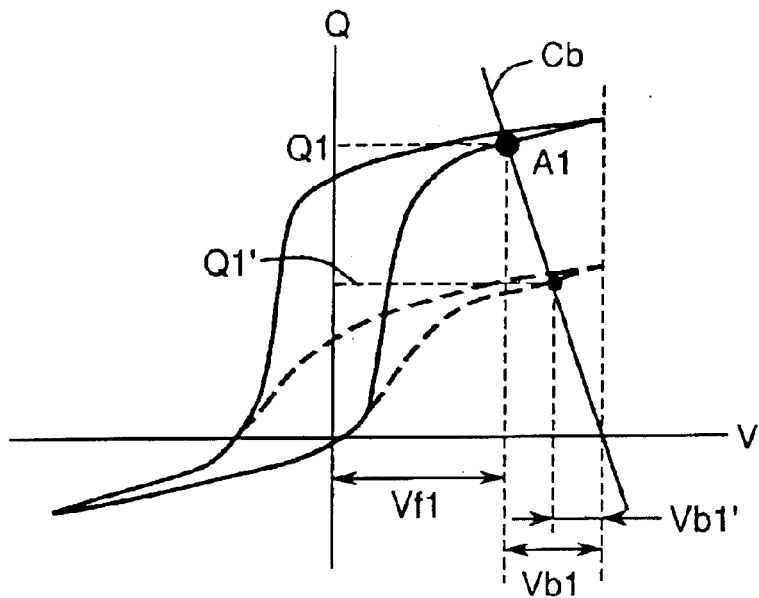
FIG. 9 is an explanatory view of a method for determining an actual bit line voltage in the case where a logical "1" has been written in the equivalent circuit shown in FIG. 8.
Figure 10:
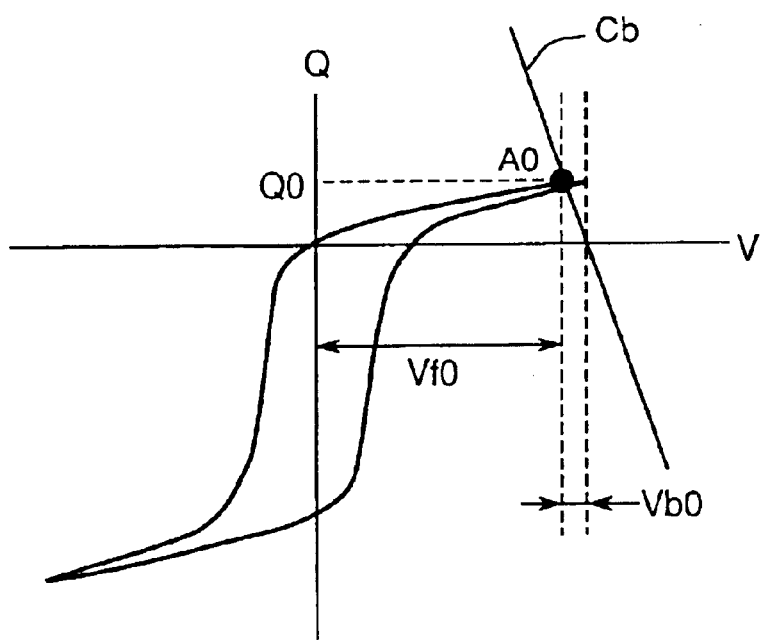
FIG. 10 is an explanatory view of a method for determining an actual bit line voltage in the case where a logical "0" has been written in the equivalent circuit shown in FIG. 8.

In this embodiment, N bit lines BL are connected in series via the N block-selector transistors BTR, each bit line BL has a memory cell block MB in which M memory cells MC are connected in parallel, and the memory cell blocks MB and the memory cells MC are disposed in a matrix array as shown in FIG. 6. Further, the word lines WL and the block-selector lines BWL are connected to a row decoder 3, and the bit lines BL and the drive lines DL are connected to a column decoder 4.

Hereinbelow, the unit in which the above N bit lines BL (memory cell blocks MB) are connected in series via the block-selector transistors BTR will be referred to as a bit line string BLS.

Further in this embodiment, as shown in FIG. 4, the ferroelectric capacitor FC is connected to the drive line DL side, while the selector transistor CTR is connected to the bit line BL side. However, it may also be implemented without any problem that one electrode of the ferroelectric capacitor FC is connected to the bit line BL while the main electrodes of the selector transistor CTR are connected to the other electrode of the ferroelectric capacitor FC and the drive line DL.

In this embodiment, as in the case of the foregoing first embodiment, SBT is used as the ferroelectric material. Also, one bit line string BLS is composed of four memory cell blocks MB (N=4), and 32 memory cells MC are connected to one memory cell block MB (M=32). This means that 128 memory cells MC are connected to one bit line string BLS. The stray capacitance Cb owned by one bit line BL is about 150 fF.

If the number of memory cells MC connected in parallel to the bit line BL is increased over 32, the stray capacitance (wiring capacitance) Cb of the bit line BL also increases over 150 fF. As a result, as can be seen from FIGS. 3A and 3B, the gradient "−Cb" of a load line passing the point (V,Q)=(VD,0) would be increased, so that the output voltage Vb1 to the bit line BL particularly in the inversion mode would be lowered, causing the read margin to be decreased. Therefore, in this embodiment, the memory cell block MB is formed by the bit line BL in which 32 memory cells MC are connected in parallel, and the bit lines BL of four memory cell blocks MB are connected in series via the block-selector transistors BTR. Thus, by setting the number of memory cells MC connected to the bit line BL of one memory cell block MB so that the stray capacitance (wiring capacitance) Cb of the bit lines BL becomes about 150 fF, both enhanced multiple memory cells and optimum read margin can be fulfilled at the same time in the semiconductor storage device.

Next, read operation of the semiconductor storage device having the above constitution is explained. Referring to FIGS. 4 to 6, all the block-selector transistors BTR are turned ON by the row decoder 3 via the block-selector lines BWL, and paired bit lines BL and the drive lines DL are selectively pre-charged by the column decoder 4 so as to become equal in potential to each other. After that, block-selector transistors BTR connected to both ends of selected bit line BLn are turned OFF by the row decoder 3, setting the selected bit lines BL floating, and the selector transistors CTR are turned ON by the row decoder 3 via the word lines WL within the selected memory cell blocks MB, and the drive lines DL are boosted up to a drive voltage VD=5 V by the column decoder 4.

Then, assuming that the voltage occurring to the selected bit lines BL is Vb, the performance chart for a case where data "1" has been written (a case of inversion) results in one shown in FIG. 3A as in the foregoing first embodiment. Also, the performance chart for a case where data "0" has been written (a case of non-inversion) results in one shown in FIG. 3B. Accordingly, ON/OFF control of the read transistors STR is performed according to data written in selected ferroelectric capacitors FC, thus allowing data read by read output lines SL to be achieved.

Subsequent to the read operation as described above, a rewrite operation based on a read result can be carried out. That is, the block-selector transistors BTR connected to both ends of the selected bit line BL are turned ON, making the selected bit line strings BLS conducting. After that, based on the read result of the selected memory cells MC, if the read result is "1"s, then the selected bit lines BL are set to an appropriate rewrite voltage Vw1; if the result is "0"s, the selected bit lines BL are connected to the ground and subsequently the voltage of the drive lines DL is dropped to the ground voltage. Finally, the bit lines BL are dropped to the ground voltage to make the selector transistors CTR turned OFF, thus allowing the state prior to the read operation to be restored (rewrite operation).

Next, write operation is explained. First, the drive lines DL are boosted to the rewrite voltage Vw. Then, the selected bit line strings BLS are set to a voltage corresponding to data to be written into target memory cells MC (voltage Vw (V) for "1," and 0 (V) for "0"). Further, turning ON the selector transistors CTR allows "0"s to be written for a "0" write operation, while write operation is not done for a "1" write operation since no voltage difference occurs to between the electrodes of the ferroelectric capacitors FC. Furthermore, dropping the drive lines DL to the ground allows "1" to be written for a "1" write operation, while the "0" state is maintained as it is for a "0" write operation.

As shown above, in this embodiment, M memory cells MC in each of which the ferroelectric capacitor FC and the selector transistor CTR are connected in series similarly to that of the first embodiment are connected in parallel between the drive line DL and the bit line BL, thereby constituting the memory cell block MB. Then, the bit line string BLS is formed by connecting in series the bit lines BL of N memory cell blocks MB via N block-selector transistors BTRn, and this bit line string BLS is arrayed in a plurality, so that the memory cell blocks MB and the memory cells MC are arrayed in a matrix.

Accordingly, as in the case of the foregoing first embodiment, selector transistors CTR of memory cells MC arrayed along the row direction are turned ON by turning the word lines WL to "H" level by the row decoder 3, so that the memory cells MC are selected on the row basis. Then, the pre-charging of bit lines BL and drive lines DL, the floating of bit lines BL and the boosting of drive lines DL are performed by the column decoder 4 on the bit line string BLS basis. In this connection, the floating process is performed further on the memory cell block MB basis. Then, by detecting the output of the read output line SL, memory cells MC located at cross-points between the selected word lines WL and the boosted drive lines DL can be accessed.

Also, as described above, in this embodiment, the memory cell block MB is formed by a bit line BL in which 32 memory cells MC are connected in parallel, and bit lines BL of four memory cell blocks MB are connected in series via the block-selector transistors BTR. Then, the floating of bit lines BL and the selection of memory cells MC are performed on the memory cell block MB basis. Thus, enhanced multiple memory cells MC in the semiconductor storage device can be implemented while the wiring capacitance Cb of each bit line BL is set to about 150 fF that allows an optimum read margin AV to be obtained.

It is noted that the present invention is not limited to the above first embodiment and second embodiment. The invention includes such alternative constitutions as shown below, which could easily be conceived by those skilled in the art from the foregoing embodiments.

That is, whereas SBT is used as the ferro-electric material to be used for the ferroelectric capacitor FC in the foregoing embodiments, it is also possible to use other ferroelectric materials such as PZT (Pb $(Zr_xTi_{1-x})_3$ and BTO ($Bi_4Ti_3O_{12}$). Also, the ferroelectric capacitor FC that has been used above has ferroelectric characteristics of an anti-voltage Vc of 1 V and a remanent polarization amount ΔQ of 23 $\mu C/cm^2$ or more. Further, the bit line that has been used above is assumed to have a stray capacitance of about 150 fF. However, the present invention is not limited to these.

In order to stably obtain the difference AV of voltages outputted to the bit lines BL between inversion and non-inversion, it is desirable that at the time of inversion, the hysteresis curve of a performance chart drawn by the ferroelectric capacitor FC intersects a load line representing the bit line capacitance Cb in the inversion region (a region where the charge amount abruptly changes before and after the anti-voltage). Further, the smaller the anti-voltage of the ferroelectric capacitor FC is, the larger the output voltage Vb1 to the bit line BL can be obtained at the inversion. However, excessively small anti-voltages would cause the electric capacitance at non-inversion to become larger so that the output voltage Vb0 to the bit line BL at non-inversion to be larger, in which case the voltage difference AV would be smaller resultantly.

Accordingly, the wiring capacitance Cb of the bit line BL is desirably not less than ½ and not more than 5 times the electric capacitance of the ferroelectric capacitor FC that does not include the inverted charge amount. Further, the anti-voltage of the ferroelectric capacitor FC is desirably not less than 1/10 and not more than ½ of the read drive voltage VD. Furthermore, it is desirable that when voltage is applied to the ferroelectric capacitor FC up to its operating voltage to cause polarization inversion, the resultant capacitance including polarization inversion components is not less than two times the capacitance of the paraelectric components that does not include the polarization inverted components of the ferroelectric capacitor FC.

By so doing, at the time of inversion, the hysteresis curve intersects the load line representing the bit line capacitance Cb in the inversion region of the performance chart of the ferroelectric capacitor FC. Therefore, as a result, the voltage applied to between the electrodes of the ferroelectric capacitor FC at a read in the inversion mode is such an anti-voltage level at most as necessary for the ferroelectric to be inverted. Thus, such problems of reliability as fatigue or imprints in the ferroelectric can considerably be reduced.

Furthermore, the bit lines BL and the drive line DL are disposed in parallel in the semiconductor storage devices of the foregoing embodiments. However, the present invention is not limited to this, and the bit lines BL and the drive lines DL may also be disposed vertical to each other. In that case, however, the word lines WL and the drive lines DL, which are connected to the gate electrodes of the selector transistors CTR, are arrayed in parallel to each other. Accordingly, through the selection by the word line WL and the application of the drive voltage by the drive line DL, memory cells MC connected in parallel to the relevant word line WL and drive line DL are accessed, thus enabling 1-line batch operation to be achieved.

In addition, the semiconductor storage devices of the foregoing embodiments can easily be manufactured without making any substantial changes of the manufacturing process for semiconductor storage devices using 1T1C type ferroelectric memories incorporating sense amplifiers and reference cells according to the prior art. Thus, the semiconductor storage devices have a very large industrial value.

As apparent from the foregoing description, in the semiconductor storage device of the present invention, a memory cell is formed by connecting a ferroelectric capacitor and a selector transistor in series, and a drive line is connected to either one of the ferroelectric capacitor or the selector transistor, while a bit line is connected to the other one, and moreover a gate electrode of a read transistor is connected to the bit line. Therefore, in the read operation, ON/OFF control of the read transistor can be performed according to data written in the ferroelectric capacitor, so that the data of the ferroelectric capacitor can be determined depending on an output of the read transistor.

Thus, by performing read operation without using a sense amplifier, the number of memory cells connected to the bit line can be reduced and therefore the wiring capacitance of the bit line can be lowered, without incurring any increases in area and cost, as would be involved in the case where the sense amplifier is used. Accordingly, the voltage induced to the bit line can be regarded as not depending on the absolute quantity of remanent polarization of the ferroelectric capacitor. As a result, it becomes implementable to reduce the capacitor area of the ferroelectric capacitor and to fulfill a high-integration semiconductor storage device.

Furthermore, since the sense amplifier is not used, reference cells are also unnecessary. Accordingly, increases in area and cost due to increases in the number of reference cells because of increases in the number of bit lines can also be suppressed.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor storage device comprising:
    a memory cell which includes a ferroelectric capacitor and a selector transistor, the ferroelectric capacitor comprising a first electrode, a second electrode opposed to the first electrode, and a ferroelectric thin film sandwiched between the first electrode and the second electrode, and the selector transistor having a first main electrode electrically connected to the second electrode of the ferroelectric capacitor;
    a drive line electrically connected to either one of the first electrode of the ferroelectric capacitor or a second main electrode of the selector transistor;
    a bit line electrically connected to the other one of the first electrode of the ferroelectric capacitor or the second main electrode of the selector transistor, the bit line being electrically connected to a decoder so that said ferroelectric capacitor of the memory cell is not located between the bit line and the decoder; and
    a read transistor having a gate electrode electrically connected to the bit line.

2. The semiconductor storage device according to claim 1, wherein
    at least two of the memory cells are connected in parallel to the bit line, and one main electrode of a block-selector transistor is connected to one end of the bit line, thereby constituting a memory cell block;
    the bit lines of at least two of the memory cell blocks are connected in series via the block-selector transistor.

3. The semiconductor storage device according to claim 1, wherein the bit line and the drive line are disposed in parallel to each other.

4. The semiconductor storage device according to claim 1, wherein the bit line and the drive line are disposed vertical to each other.

5. The semiconductor storage device according to claim 1, wherein electric capacitance of the bit line is not less than ½ and not more than five times electric capacitance of the ferroelectric capacitor that does not include any inverted charge amount.

6. The semiconductor storage device according to claim 1, wherein anti-voltage of the ferroelectric capacitor is not less than 1/10 and not more than ½ of its drive voltage.

7. The semiconductor storage device of claim 1, wherein the gate electrode of the read transistor is electrically connected to the bit line and the ferroelectric capacitor is not located therebetween.

8. The semiconductor storage device of claim 1, wherein the gate electrode of the read transistor is electrically connected to the bit line and the selector transistor is not located therebetween.

9. A semiconductor storage device comprising:
    a memory cell which comprises a ferroelectric capacitor and a selector transistor, the ferroelectric capacitor comprising a first electrode, a second electrode opposed to the first electrode, and a ferroelectric thin film sandwiched between at least the first electrode and the second electrode, and the selector transistor comprising a first electrode electrically connected to the second electrode of the ferroelectric capacitor;
    a drive line electrically connected to the first electrode of the ferroelectric capacitor so that the selector transistor is not located between the drive line and the ferroelectric capacitor;
    a bit line electrically connected to a second electrode of the selector transistor so that the ferroelectric capacitor is not located between the bit line and the second electrode of the selector transistor; and
    a read transistor having a gate electrode electrically connected to the bit line, so that the selector transistor is not located between the read transistor and the bit line.

10. The semiconductor storage device of claim 9, wherein the bit line is electrically connected to a decoder so that said ferroelectric capacitor of the memory cell is not located between the bit line and the decoder.

11. The semiconductor storage device of claim 9, wherein the gate electrode of the read transistor is electrically connected to the bit line and the ferroelectric capacitor is not located therebetween.

* * * * *